United States Patent
Wang et al.

(10) Patent No.: US 9,269,833 B2
(45) Date of Patent: Feb. 23, 2016

(54) METHODS AND APPARATUS FOR HYBRID MOS CAPACITORS IN REPLACEMENT GATE PROCESS

(75) Inventors: Pai-Chieh Wang, Zhubei (TW); Tung-Heng Hsieh, Zhudong Town (TW); Yimin Huang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 450 days.

(21) Appl. No.: 13/303,096

(22) Filed: Nov. 22, 2011

(65) Prior Publication Data

US 2013/0126955 A1 May 23, 2013

(51) Int. Cl.
| | |
|---|---|
| H01L 29/94 | (2006.01) |
| H01L 27/06 | (2006.01) |
| H01L 27/08 | (2006.01) |
| H01L 49/02 | (2006.01) |

(52) U.S. Cl.
CPC ............ *H01L 29/94* (2013.01); *H01L 27/0629* (2013.01); *H01L 27/0811* (2013.01); *H01L 28/20* (2013.01)

(58) Field of Classification Search
CPC ............ H01L 23/5223; H01L 27/0629; H01L 27/105; H01L 27/11568; H01L 28/60
USPC .......... 257/296, 300, 532, E27.016, E27.034, 257/E29.345
See application file for complete search history.

(56) References Cited

U.S. PATENT DOCUMENTS

| | | | | |
|---|---|---|---|---|
| 6,225,669 | B1 * | 5/2001 | Long et al. | 257/401 |
| 8,242,581 | B1 * | 8/2012 | Ratnakumar et al. | 257/595 |
| 2004/0043558 | A1 * | 3/2004 | Wieczorek et al. | 438/241 |
| 2006/0244061 | A1 * | 11/2006 | Nowak et al. | 257/347 |
| 2007/0001203 | A1 * | 1/2007 | Lehr et al. | 257/296 |
| 2008/0308870 | A1 * | 12/2008 | Faul et al. | 257/368 |
| 2009/0004809 | A1 * | 1/2009 | Chinthakindi et al. | 438/393 |
| 2009/0032889 | A1 * | 2/2009 | Zhu et al. | 257/410 |
| 2009/0101956 | A1 * | 4/2009 | Booth et al. | 257/301 |
| 2009/0101989 | A1 * | 4/2009 | Chen et al. | 257/379 |
| 2009/0242953 | A1 * | 10/2009 | Booth et al. | 257/301 |
| 2010/0112808 | A1 | 5/2010 | Gurtej et al. | |
| 2012/0049291 | A1 * | 3/2012 | Scheiper et al. | 257/380 |
| 2013/0126953 | A1 | 5/2013 | Wang et al. | |

* cited by examiner

*Primary Examiner* — Minh-Loan Tran
*Assistant Examiner* — Leslie Pilar Cruz
(74) *Attorney, Agent, or Firm* — Slater & Matsil, L.L.P.

(57) ABSTRACT

Methods and apparatus for hybrid MOS capacitors in replacement gate process. A method is disclosed including patterning a gate dielectric layer and a polysilicon gate layer to form a polysilicon gate region over a substrate; forming an interlevel dielectric layer over the substrate and surrounding the polysilicon gate region; defining polysilicon resistor regions each containing at least one portion of the polysilicon gate region and not containing at least one other portion of the polysilicon gate region, forming dummy gate regions removing the dummy gate regions and the gate dielectric layer underneath the dummy gate regions to leave trenches; and forming high-k metal gate devices in the trenches. A capacitor region including a high-k metal gate and a polysilicon gate next to the high-k metal gate is disclosed. Additional hybrid capacitor apparatuses are disclosed.

18 Claims, 8 Drawing Sheets

METHODS AND APPARATUS FOR HYBRID MOS CAPACITORS IN REPLACEMENT GATE PROCESS

RELATED APPLICATIONS

This application relates to the following co-pending and commonly assigned U.S. application Ser. No. 13/303,083, filed on Nov. 22, 2011, entitled "Methods and Apparatus for MOS Capacitors in Replacement Gate Process," which application is hereby incorporated herein by reference.

BACKGROUND

A common requirement for semiconductor processing of integrated circuits is the formation of capacitors. Because the gates for MOS transistors lie over a dielectric material, these structures are also used as capacitors. The gate material can form one plate of capacitor, the dielectric material can form the capacitor dielectric, and the second plate of the capacitor may be formed by a doped conductive region in the substrate beneath the dielectric. MOS capacitors are particularly useful as capacitors that may be implemented on integrated circuits that also feature, for example, MOS transistors, resistors, memory cells, and other logic and circuit devices.

Recently the use of metal material as the gate conductors with high-k gate dielectrics has become more prevalent in "high-k metal gate" or "HKMG" semiconductor processes. As the metal gate conductors lie over a dielectric layer, MOS capacitors may be formed by using the metal gate conductor of the HKMG device as a first plate, the high-k dielectric material as the capacitor dielectric, and the second plate may be formed beneath the dielectric, for example by doping the substrate to form a conductive region. In this manner metal gate MOS capacitors may be formed in a HKMG replacement gate process. The metal gate material may be formed in a replacement gate process by replacing a previously formed dummy gate. The dummy gates are formed earlier in the process and may be used for certain process steps. Then, using photolithography pattern and etch steps to remove the dummy gates and the original gate dielectric, the replacement gate process exposes a gate trench area in an interlevel dielectric layer. High-k dielectrics may be used to form the dielectric in the replacement gate region. The metal replacement gate can be formed in a variety of ways, for example by deposition or plating, and then removing excess metal in a chemical mechanical polishing (CMP) process.

However, in order to obtain a capacitance of a useful value, a large metal area metal gate device, or many metal gate devices would be required in a small area of the semiconductor substrate. In the metal gate replacement processes, CMP loading effects can occur when the metal pattern exceeds a certain pattern density in a given area being processed. In CMP loading, dishing of the top portion of gate metal material has been observed during the CMP processing. The dishing is a defect and causes reduced device yields and increasing costs. This makes the use of MOS capacitors formed using metal replacement gate HKMG devices more costly, or even impractical.

BRIEF DESCRIPTION OF THE FIGURES

For a more complete understanding of the present invention, and the advantages thereof, reference is now made to the following descriptions taken in conjunction with the accompanying drawings, in which.

DETAILED DESCRIPTION

Figure 1:
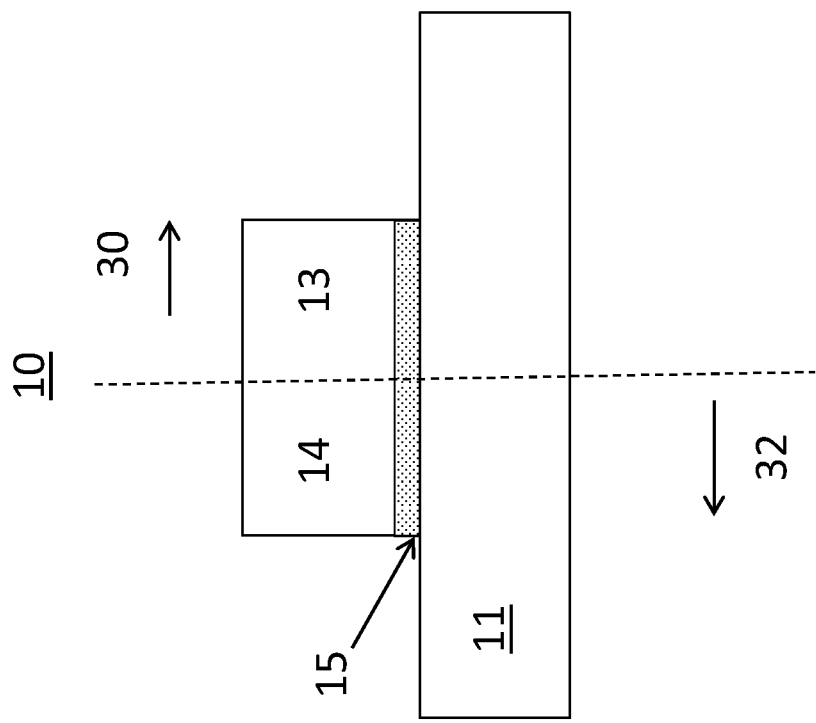
FIG. 1 depicts in a cross-sectional view an exemplary embodiment at an intermediate process step.

The making and using of example and illustrative embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed inventive concepts, and do not limit the scope of the disclosure and do not limit the scope of the appended claims.

Embodiments of the present application, examples of which are now described in detail, provide novel methods and apparatus for manufacturing semiconductor devices; including providing a method for forming hybrid HKMG and polysilicon MOS capacitors in a HKMG replacement gate process. The polysilicon capacitors may be formed using the process steps similar to those used for polysilicon resistors in the HKMG process, for example, and few if any new process steps are needed. By including gates for the polysilicon MOS capacitors among gates for the HKMG gate MOS capacitors, the pattern density of the metal material is reduced, avoiding or eliminating the CMP loading problems that may occur using the prior known approaches. Portions of the polysilicon are identified for replacement gate processing, and using photolithographic patterning, a hard mask is formed over these portions. In some embodiments a pattern of alternating regions of HKMG devices and regions of the polysilicon gate devices may be used, although alternative arrangements are also contemplated as additional embodiments. The mask is used for dummy removal etch processes to remove alternating strips of the polysilicon, which are now defined as dummy gate portions. The trench areas that remain after the dummy gate etch removal then replaced with high-k dielectric and metal gates to form HKMG capacitor devices. Thus, the polysilicon MOS capacitors may be formed alongside and alternating with the HKMG replacement capacitor devices. The hybrid HKMG and polysilicon MOS capacitors of the embodiments may be combined as a plurality of MOS capacitor strips that may be electrically coupled in parallel to obtain desired capacitance values. For example, a plurality of hybrid MOS gate capacitors may be arranged as parallel strips over a common bottom plate diffusion. An overlying metal connective layer, such as metal-1, may be used to form a common top plate connector. The alternating polysilicon MOS capacitors and HKMG capacitors are combined on a single substrate and the method embodiments provide a process so that both may be used in the same device. The capacitor devices may be further coupled, if desired, to form a circuit.

The novel use of the hybrid HKMG and polysilicon MOS capacitors of the disclosure lowers the pattern density in the metal gate material, thus the CMP loading problems of prior known approaches are reduced or eliminated by use of the embodiments. Lowering the metal pattern density during CMP processes eliminates or greatly reduces the possibility of dishing that occurs due to CMP loading in known replacement gate processes. Further, the use of the embodiments provides additional capacitance with higher values per unit area than the corresponding prior HKMG capacitors, so that when compared to prior approaches, use of the methods and apparatus of the embodiments provide better device performance, better process performance, and higher yield without substantial added costs or any need for changes to existing process equipment or materials. The polysilicon capacitor strips may be spaced apart by the metal gate strips, and conveniently, existing process design rules for polysilicon-to-polysilicon minimum spacing (polysilicon-to-polysilicon minimum pitch) may be met and no modification of the semiconductor process rules is necessary in order to use the embodiments.

FIG. 1 depicts in a cross-sectional view an embodiment device 10 at an intermediate processing stage, including a polysilicon gate region 13 formed over a substrate 11. Substrate 11 may be a silicon wafer, another semiconductor wafer, an epitaxial layer of semiconductor material, an semiconductor on insulator ("SOI") layer, as non-limiting examples. Prior to the intermediate stage shown in FIG. 1, the substrate 11 received a gate dielectric 15, such as a gate oxide or gate nitride dielectric, formed over the substrate using, for example, thermal oxidation, PVD, CVD, PECVD, TEOS, spinning on or other methods for gate dielectric deposition. In an example embodiment a silicon oxynitride (SiON) gate dielectric is deposited. A layer of polysilicon was deposited over the dielectric layer.

In FIG. 1, the region 30 shown on one side of the substrate 11 is selected to be a polysilicon resistor processing region. The remaining region 32 is to be free of the resistor processing steps. In HKMG processes, polysilicon processing may be provided for forming resistors. Conveniently, these existing process steps may also be used with the method embodiments of this disclosure to form capacitors with polysilicon gate material. The portion of the polysilicon gate region 14 that lies in the region 32, which is not to be processed as polysilicon resistor material, will be a dummy gate portion to be removed in later processing steps.

A polysilicon resistor implant process is performed only on the polysilicon material in region 30 as this implant is not needed on the dummy gate polysilicon 14 in region 32. To accomplish the resistor implant, a photolithographic patterning step is used to form and pattern a mask over the polysilicon 14, and an ion or other implant step is performed over region 30. The implant mask is then removed. The polysilicon is then patterned further to define the polysilicon gate 13 shown in FIG. 1 using a second photolithographic process, patterning a poly etch hardmask material over the polysilicon, using photoresist to pattern the etch mask, and then etching to remove the exposed polysilicon to define the parallel polysilicon gate 13. Gate 13 is now divided into a polysilicon resistor material in region 30, and a dummy polysilicon gate 14 in region 32.

Figure 2:
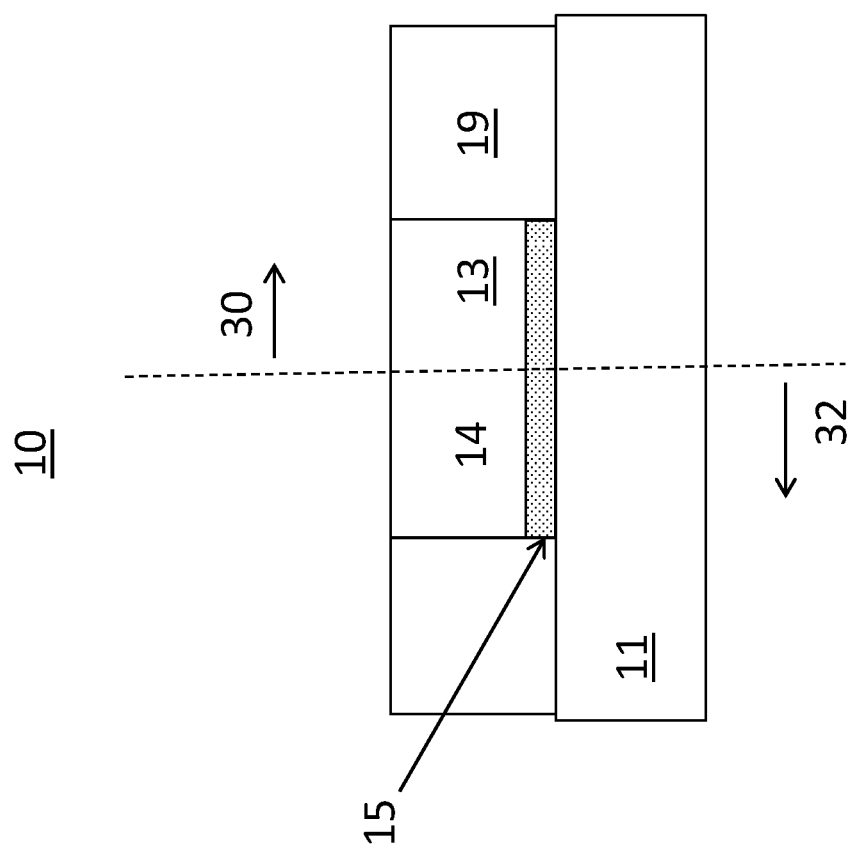
FIG. 2 depicts in a cross-sectional view the embodiment of FIG. 1 following further process steps.

FIG. 2 depicts the device 10 in a cross-sectional view following additional processing. In FIG. 2, inter-level or interlayer dielectric layer (ILD) 19 is formed over the polysilicon gate 13 and dummy gate 14 and extending to the surface of the substrate 11. Note that, for simplicity, no gate sidewalls or gate spacers are shown in the figures on the gate 13; however, in an actual process, gate sidewalls formed of oxides, nitrides, oxynitrides or combinations, and having one or several layers, may be formed on the sidewalls of the polysilicon gate 13. Gate spacers may be formed to control implant spacing and provide self-alignment for source and drain diffusions, ion implants, tilt angle implants and the like. Sacrificial gate sidewall spacers may be used. To transition from the intermediate process stage of FIG. 1 to the cross-section of FIG. 2, several process steps are performed. The ILD layer 19 is deposited. This ILD dielectric 19 may be formed, as non-limiting examples, of silicon dioxide, silicon nitride, silicon oxynitride, carbon containing dielectrics, TEOS, and combinations of these, and may be low-k, high-k or oxide dielectric, and may be formed of other known materials for ILD layers. Atomic level deposition (ALD), CVD, PECVD, PVD, thermal oxidation, or spin on steps may be used to form the ILD 19.

After ILD deposition, a chemical mechanical polishing (CMP) step "ILD CMP" may be performed to remove excess ILD material and planarize the top surface of the ILD with the top surfaces of the polysilicon gate 13, so the top surfaces of the polysilicon are exposed at the surface of the ILD layer 19. If CMP is not used, then ILD chemical etching processes may be used instead.

Figure 3:
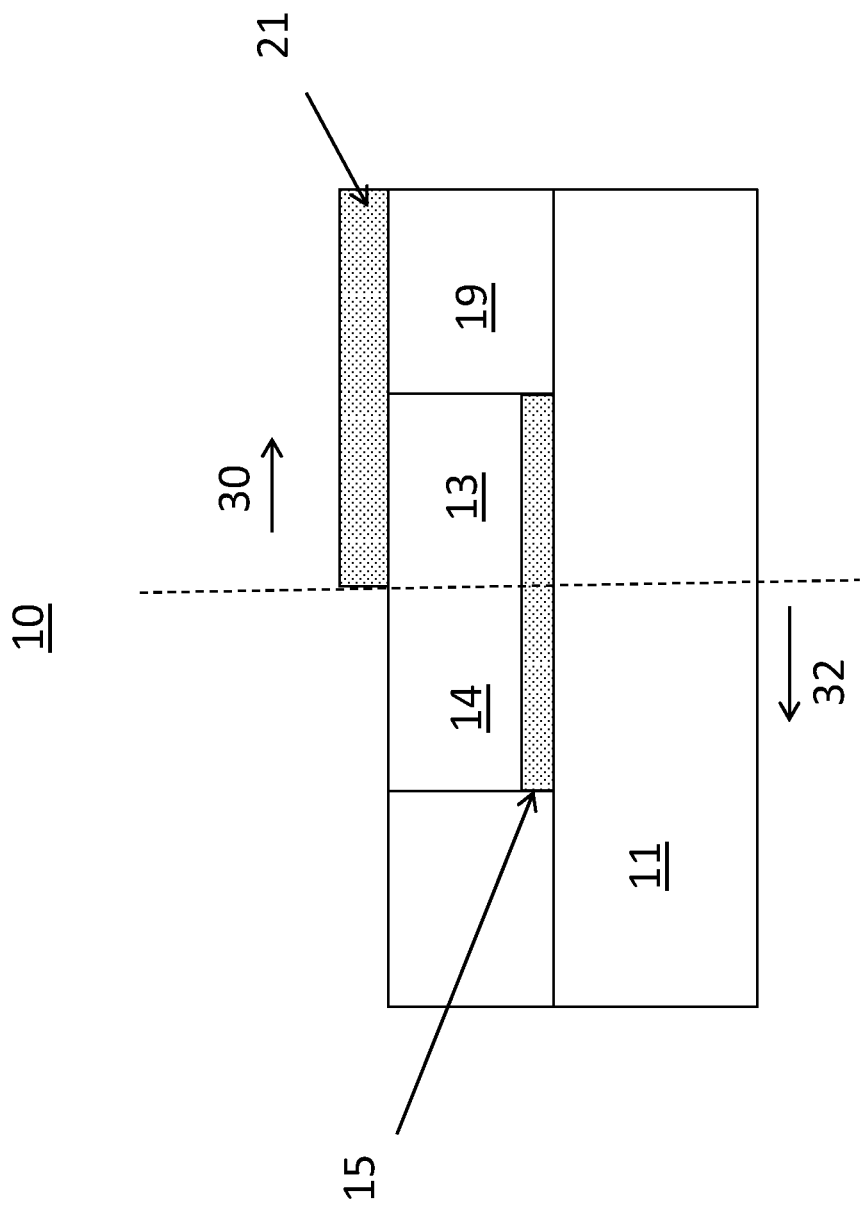
FIG. 3 depicts in a cross-sectional view the embodiment of FIG. 2 following further process steps.

FIG. 3 depicts device 10 of FIG. 2 in a cross-sectional view following additional process steps. In FIG. 3, a hardmask 21 is formed over the region 30 to protect the portion of the polysilicon gate 13 in the resistor region 30. This hardmask 21 may be of any material that is compatible with a selective etch process. Polysilicon 14 is now a "dummy gate" portion and, as shown in FIG. 3, is exposed and ready to be removed by subsequent process steps. To transition from the intermediate stage of the process shown in FIG. 2 to the stage illustrated in FIG. 3, several process steps were performed. A hardmask of an oxide or other etch mask was formed over the substrate 11. A photolithographic process was formed to deposit photoresist and pattern the photoresist, and an etch of the hardmask was done to pattern the hardmask 21 as shown in FIG. 3. The remaining photoresist material was then removed by stripping. Alternatively, in some embodiments, the photoresist may remain over the hardmask 21.

Figure 4:
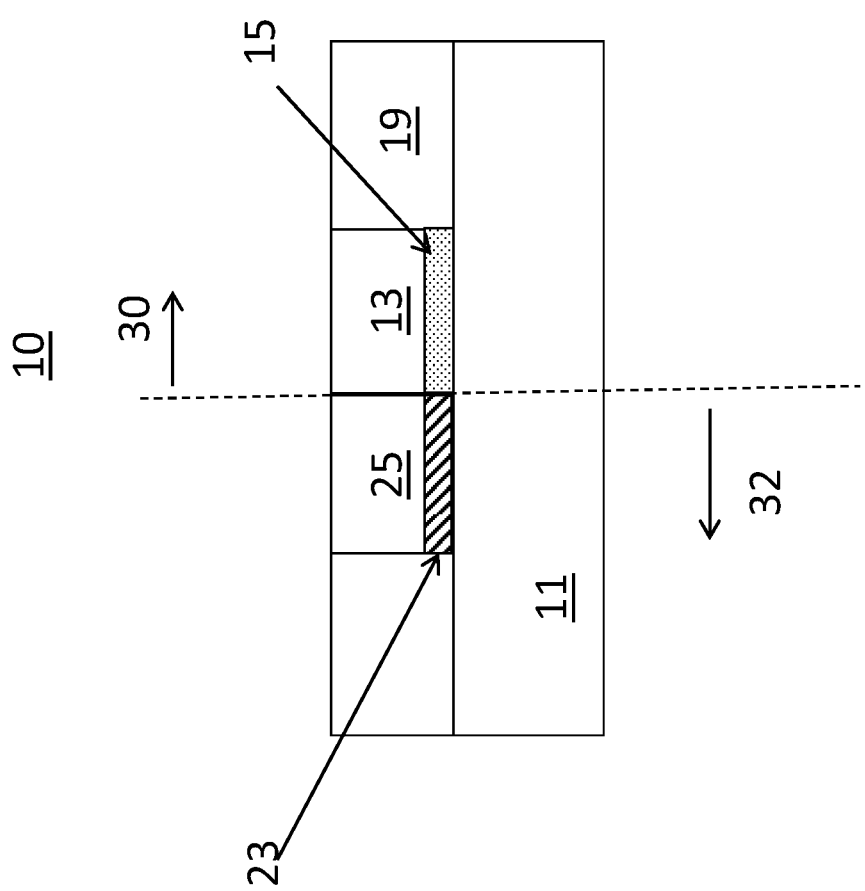
FIG. 4 depicts in a cross-sectional view the embodiment of FIG. 3 following additional process steps.

FIG. 4 depicts the device 10 in cross-section as shown in FIG. 3 following additional processing steps. In FIG. 4, the dummy gate 14 and the gate dielectric underlying dummy gate 14 have been removed, for example by the above described etching processes. A high-k dielectric 23 has been deposited and a metal containing gate material 25 has been formed in the trench in ILD 19 that remained after the dummy gate removal. The high-k dielectric 23 and the metal gate 25 have replaced the dummy gate 14 shown in FIG. 3.

Several process steps were performed to transition from the intermediate stage shown in FIG. 3 to the cross-section of device 10 in FIG. 4. The dummy polysilicon 14 was removed by an etch process. The gate dielectric 15 beneath the dummy polysilicon gate 14 was also removed. High-k gate dielectric material was deposited to form metal gate dielectric 23. A high-k dielectric has a dielectric constant, k, greater than that of silicon dioxide (oxide) dielectric, or greater than about 3.8. The material used can be any high-k gate dielectric; in one example, a hafnium based material is used, such as hafnium oxide. Other high-k gate dielectrics include, as non-limiting examples, hafnium silicate, zirconium silicate, hafnium dioxide and zirconium dioxide. The high-k dielectric may typically be deposited using atomic layer deposition (ALD) although the embodiments may include other processes for the dielectric deposition.

A metal gate 25 is provided in the opening in ILD 19 as shown in FIG. 4. This metal gate may be formed by deposition such as ALD or other deposition processes. Alternatively the metal gate may be formed by sputtering the metal seed layer, depositing the metal gate material by electroplating. A CMP process is then performed to remove excess metal from the surface of ILD 19, and to planarize ILD 19 and the surface of the metal gate 25 with the surface of polysilicon gate 13. Refractory metals including tungsten (W), titanium (Ti), and W/TiN layers may be used. Other metals may be used including tantalum (Ta), and molybdenum (Mo), and alloys of these may be used. Aluminum (Al) may be used. Multiple layers for the metal gate may be used, for example, a TiN layer may be used as a first layer in the metal gate 25 to adjust the work function of a high-k metal gate device, and partially fill the trench, and an aluminum conductor layer may then be deposited to complete the conductor layer. Barrier layers and diffusion layers may be used in forming the metal gate 25.

Thus, as shown in FIG. 4, device 10 contains both a high-k metal gate capacitor device 25 with high-k dielectric 23, with the metal gate 25 forming the top plate of the capacitor, and a polysilicon capacitor having a top plate of gate 13 that is a polysilicon doped for a resistor, for example, over a gate dielectric 15. The embodiments thus allow both HKMG capacitors and polysilicon MOS capacitors to exist in the same area or region of the substrate 11. Because the polysilicon resistor capacitors reduce the metal pattern density for CMP, the capacitors may be formed including the HKMG MOS capacitors, without the prior art detrimental effects including CMP loading, and the CMP loading problems associated with the prior art approaches are reduced or eliminated.

Figure 5:
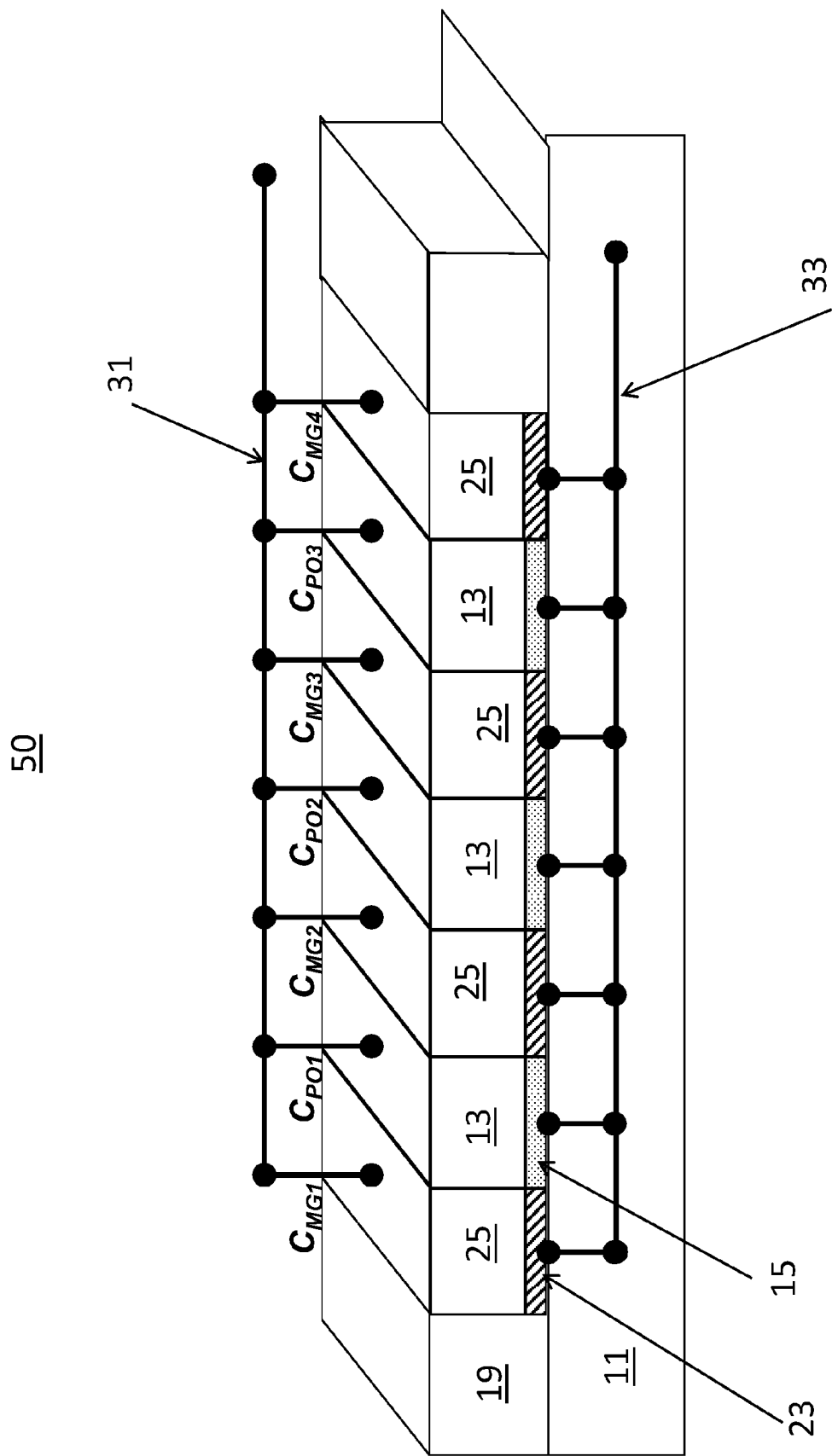
FIG. 5 depicts in a cross-sectional view another alternative embodiment including a capacitor formed of embodiment hybrid MOS capacitors coupled arranged in parallel.

FIG. 5 depicts in a cross-section a completed alternative embodiment structure 50. In FIG. 5, a semiconductor substrate 11 such as a wafer, or an epitaxial layer such as a silicon on insulator (SOI) layer, is shown. Alternating HKMG devices are formed of metal gate 25 and a high-k dielectric 23 in a replacement gate process as described above. These are coupled to form the top plates and dielectrics of HKMG MOS capacitors, labeled $C_{MG1}$, $C_{MG2}$, etc. to $C_{MG4}$. A plurality of polysilicon gates 13 may be doped as polysilicon resistors in the process, and in any event these polysilicon gates 13 form the top plates of capacitors labeled $C_{PO1}$, $C_{PO2}$-$C_{PO3}$. More or less of these polysilicon capacitors may be provided in different applications and these form additional alternative embodiments. Conveniently, the polysilicon gate strips 13 may be spaced by at least the polysilicon-to-polysilicon pitch for the replacement gate process. This minimum pitch distance is determined by the process design rules, based on the photolithographic limitations of the process. The spacing may also be greater than this distance.

By spacing the polysilicon gate 13 by the minimum poly-to-poly pitch, the capacitance per area is optimized. In alternative embodiments, the spacing between the polysilicon gates 13 could be greater than the minimum pitch, and these are alternative embodiments. Vias (not shown) couple the polysilicon gate 13, which are the upper plates for the capacitors, to a common connector 31, which forms a top plate connection. This connector 31 may be, for example, a metal layer conductor such as a metal-1 layer conductor. This conductor may be formed of aluminum or more prevalently in recent processes, copper, and other conductors such as gold, other metals, conductive composites and alloys may be used. Barrier layers and diffusion barriers may be used to form the connector 31. Vias may be used to connect the top plates to the conductor 31 and may be formed in a damascene CMP process for copper, for example, or by filling plugs with conductive via material; these approaches form alternate embodiments, but are not limiting. Similarly, the metal gates 25 of the HKMG capacitors are coupled to one another using the connector 31 and thus to the polysilicon capacitors. ILD 19 thus provides the inter-level dielectric that contains the capacitors $C_{PO1}$-$C_{PO3}$ and $C_{MG1}$-$C_{MG4}$ of the HKMG devices. Many additional devices may be formed on substrate 11 and form an integrated circuit, including transistors, resistors, inductors, memory cells, analog circuits, varactors and the like. Circuits including processors, microprocessors, digital to analog converters, power circuits, radio transceivers and the like make be formed on the substrate 11 including the HKMG capacitors and the polysilicon MOS capacitors.

The bottom plate of the parallel capacitor is indicated by connector 33, which connects the capacitors $C_{PO1}$-$C_{PO3}$ and $C_{MG1}$-$C_{MG3}$ together. The connector 33 may be conveniently provided by forming a common diffusion region doped to be conductive and therefore electrically couple all of the polysilicon capacitors $C_{PO1}$-$C_{PO3}$. In this embodiment, the HKMG and the polysilicon MOS capacitors $C_{PO1}$-$C_{PO3}$ are shown in a continuously alternating patterns, other patterns are possible. The polysilicon portion of an area including the HKMG devices should be greater than 25% to reduce the detrimental effects of the CMP loading. The polysilicon area in the embodiment of FIG. 5 is approximately 50%; of course increasing the polysilicon area will further reduce the metal pattern density and thus, still further reduce the CMP loading effects.

The total capacitance obtained by the hybrid capacitors in FIG. 5 is given by:

$$C_{TOTAL} = C_{PO1} + C_{PO2}C_{PO3} + C_{MG1} + C_{MG2} + G_{MG3} + C_{MG4} \quad \text{(Equation 1)}$$

Thus, the capacitance can be increased by adding additional hybrid capacitors by forming additional gates 25 and 13, or decreasing the number of gates, to obtain a desired value for $C_{TOTAL}$ in Equation 1. Using the standard pitch for the polysilicon gates 13 makes the use of the embodiments straightforward from a semiconductor processing standpoint. The use of the standard polysilicon does not increase CMP loading or create any difficulties in processing. The hybrid devices formed by the gates 25 and 13 could be coupled differently, for example one portion could be coupled to form another second capacitor. Additional HKMG devices could be formed proximal to the hybrid capacitor 50 by using isolation regions such as shallow trench isolation (STI) and form additional capacitors. Thus, the capacitance $C_{TOTAL}$ could further be increased by coupling the entire structure 50 to another capacitor and coupling it in parallel, using connector 31, and additional connectors, for example. Although a single hybrid capacitor device 50 is shown in FIG. 5, additional hybrid devices could also be provided to further increase the total capacitance or to form additional circuit elements.

Figure 6:
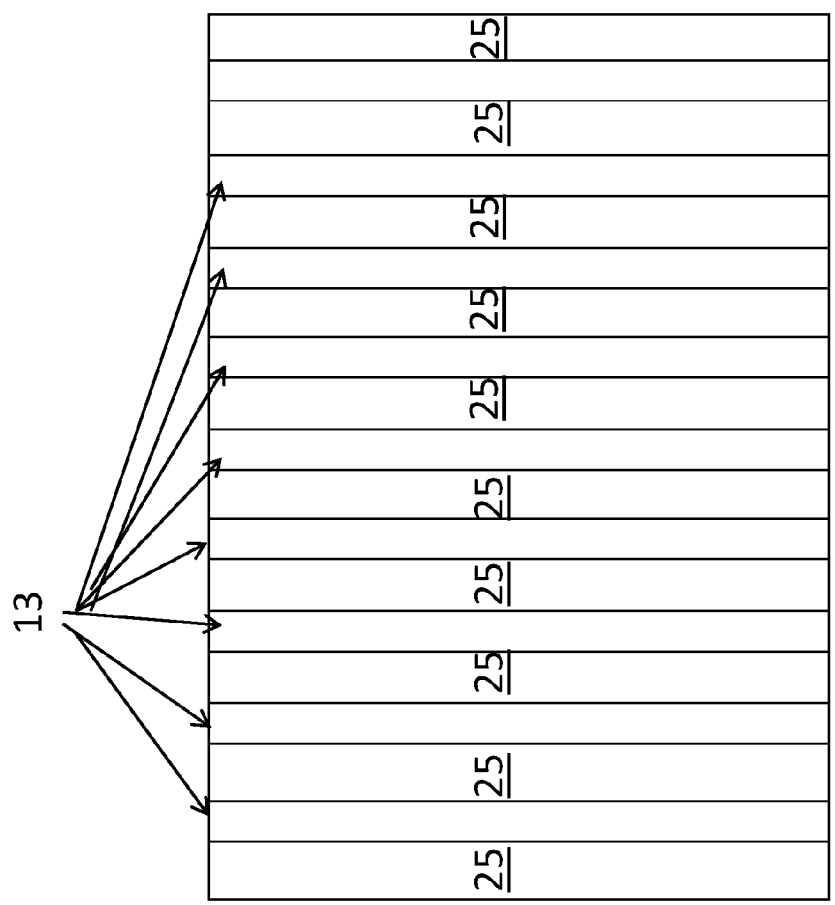
FIG. 6 depicts in a top view the embodiment of FIG. 5.

FIG. 6 depicts the hybrid HKMG and polysilicon gate regions in FIG. 5 from a top view, with metal gates 25 shown in parallel and alternating with gate 13. The polysilicon gate 13 could be spaced by the polysilicon-to-polysilicon minimum distance (poly-to-poly pitch). This minimum pitch is determined by the photolithography limits and design riles for a given metal gate semiconductor process used to fabricate the embodiments. The polysilicon spacing may also be increased, but the polysilicon capacitor density is optimized if a minimum pitch is used. The polysilicon area for a given area containing the metal gate material should be greater than about 25% to gain the advantages of the embodiments in eliminating the CMP loading problems associated with processing the metal gate material. The polysilicon area can be much greater, for example, 50% or even more.

Figure 7:
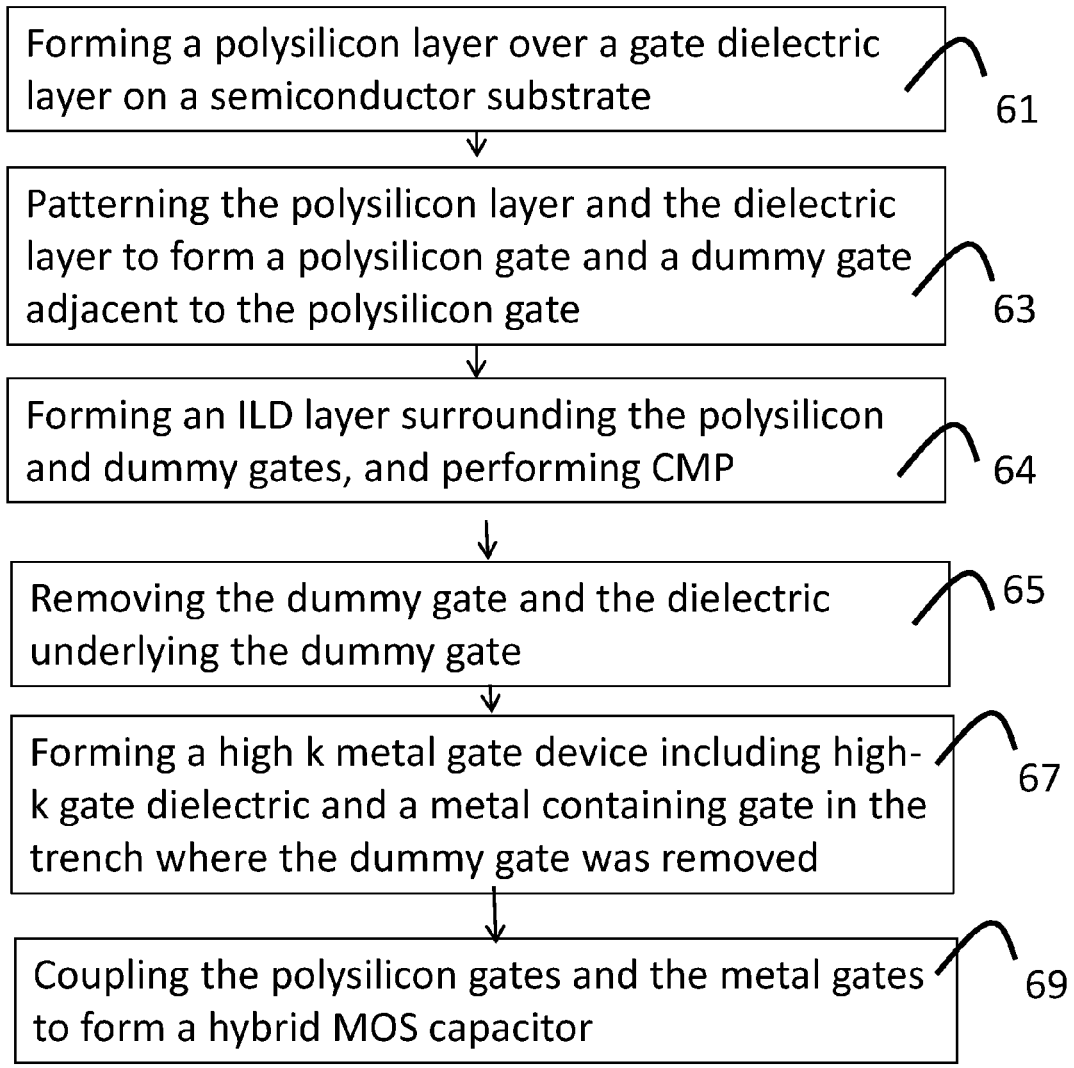
FIG. 7 depicts in a process flow diagram selected steps for an embodiment method.

FIG. 7 depicts in a process flow diagram selected steps of a method embodiment. A substrate is provided and a layer of polysilicon is deposited over a gate dielectric layer in step 61.

In step 63, the layers are patterned, and a polysilicon gate is defined next to a polysilicon dummy gate portion. At least one dummy gate is formed. In the polysilicon resistor process, the polysilicon gate portion may receive an implant as part of that process, as described above.

In step 64, an inter-level dielectric (ILD) layer is formed over the polysilicon gate and dummy gate structure. CMP may be performed to planarize the surface of the ILD and expose the top surfaces of the polysilicon gate and dummy gate portions.

In step 65, the dummy gate and the gate dielectric underlying the dummy gate are removed.

In step 67, a high-k metal gate device is formed in the trench that remains in the interlevel dielectric layer where the at least one dummy gate was removed. This replacement gate is thus formed adjacent to the polysilicon gate.

In step 69, the polysilicon gate and the metal gate are coupled together in parallel to form a parallel MOS polysilicon capacitor. In this manner, both the HKMG device and the polysilicon MOS capacitors are used to form a total capacitor. The method embodiments thus enable the HKMG MOS capacitors and the polysilicon MOS capacitors to reside together in the same area to form a hybrid MOS capacitor on the same substrate.

The method of FIG. 7 is but one illustrative embodiment, and the order of steps may be changed, and additional steps may be performed, to form alternative embodiments that are envisioned as part of this disclosure and which are within the scope of the appended claims.

Using the embodiments, capacitors are obtained that perform as well as, and even better than, capacitors formed of only HKMG gate devices. In an example process comparing capacitors formed of Al metal gates with high-k dielectrics to the polysilicon/SiON MOS capacitors of the embodiments, the density obtained (femtoFarads/area) increased by 50% when the polysilicon MOS capacitors were used. Thus, the capacitance that can be formed in a given area is greatly increased by use of the embodiments, while at the same time the process yield is improved because the metal pattern density is reduced and the accompanying CMP loading problems of the prior HKMG capacitor approach can be reduced or entirely avoided.

Figure 8:
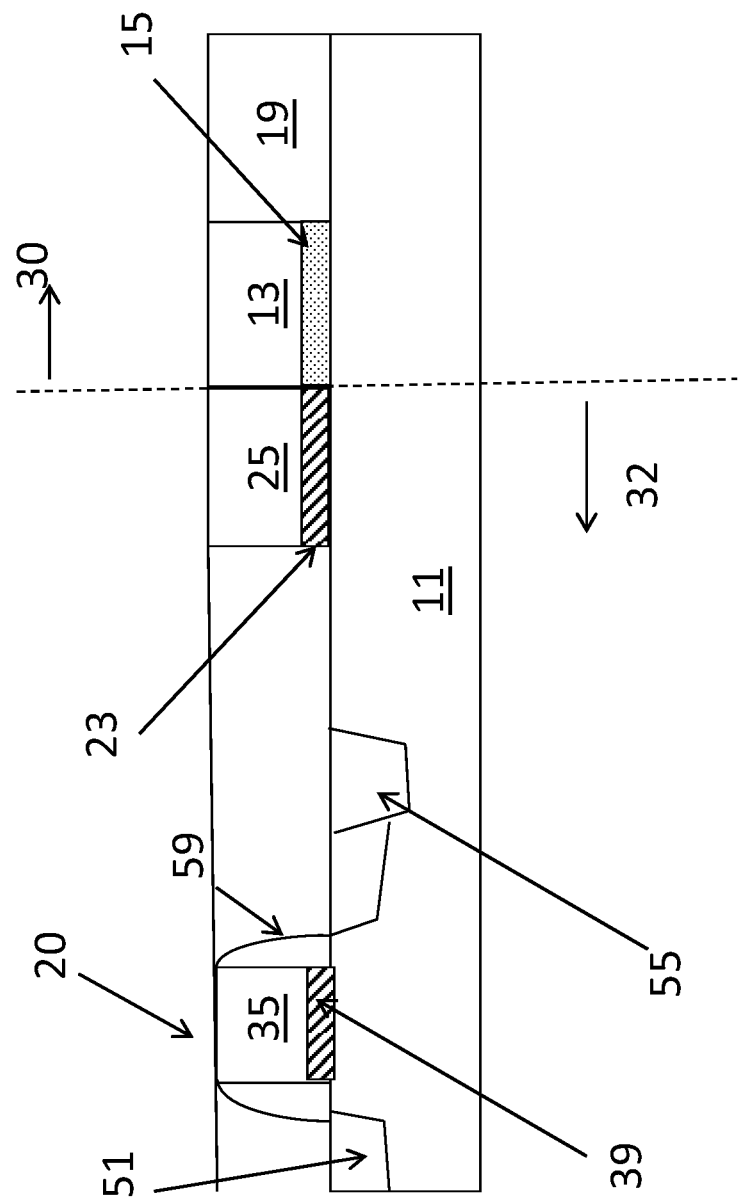
FIG. 8 depicts in a cross-sectional view an alternative embodiment The drawings, schematics and diagrams are illustrative and not intended to be limiting, but are examples of embodiments of the invention, are simplified for explanatory purposes, and are not drawn to scale.

FIG. 8 depicts in another cross-sectional view another alternative embodiment. In FIG. 8, a hybrid MOS capacitor such as that of FIG. 4 is depicted formed in a capacitor region over substrate 11, with high-k metal gate 25, polysilicon gate 13, high-k gate dielectric 23, gate dielectric 15, and an ILD layer 19 arranged as in FIG. 4, above. In addition, in this alternative embodiment, a high-k metal gate device such as a logic device is formed in a logic region in the substrate. In FIG. 8, a logic device 20 is formed which may be, for example but without limiting the embodiments, a MOS transistor. A high-k metal gate 35 is formed over the high-k metal gate dielectric 39, which is formed in the same manner and method steps as in FIG. 7 for the replacement gate process. Sidewalls 59 may be formed on the gate 35. Source/drain regions 51 may form the source and drain diffusions for a transistor, and an isolation region 55, which may be a shallow trench isolation as shown here, or other isolation region, forms an electrically isolated logic region for device 20. In this manner, the hybrid MOS capacitor may be integrated with other high-k metal gate devices to form advanced circuitry, for example.

In an embodiment, a method is provided including disposing a gate dielectric layer over a semiconductor substrate; disposing a polysilicon gate layer over the dielectric layer; patterning the gate dielectric layer and the polysilicon gate layer to form a polysilicon gate region; forming an inter-level dielectric layer over the substrate and surrounding the polysilicon gate region; defining polysilicon resistor regions each containing at least one portion of the polysilicon gate region and not containing at least one other portion of the polysilicon gate region, forming dummy gate regions; depositing a mask layer over the interlevel dielectric layer and the polysilicon gate region; patterning the mask layer to expose the dummy gate regions; removing the dummy gate regions and the gate dielectric layer underneath the dummy gate regions to leave trenches; and forming high-k metal gate devices in the trenches.

In a further embodiment, the method includes forming a connector electrically coupling the polysilicon gates in the polysilicon resistor region together, each of the polysilicon gates forming the top plate of a polysilicon MOS capacitor, the gate dielectric of each of the polysilicon gates forming the MOS capacitor dielectric. In still another embodiment, the method includes forming a connector electrically coupling the high-k metal gate devices together, each of the high-k metal gates forming the top plate of a high-k metal gate MOS capacitor, the high-k dielectric of each of the high-k metal gate devices forming the high-k metal gate MOS capacitor dielectric. In yet another embodiment, the method further includes forming a conductive region in the substrate underlying the polysilicon gate region, the conductive region forming a bottom plate of the MOS capacitors.

In additional embodiments, the above methods include wherein the total capacitance obtained is the sum of the capacitance provided by each of the polysilicon MOS capacitors and the high-k metal gate capacitors.

In further embodiments, the above methods include wherein forming a high-k dielectric includes hafnium. In yet additional embodiments, the above methods include forming a metal gate including titanium. In still additional embodiments, a metal gate is formed including aluminum. In further method embodiments, the above methods further include performing a chemical mechanical polishing on metal gates. In still further embodiments, the above methods include wherein the surface of the polysilicon resistor regions form at least 25% of the surface area of the gate region.

In an alternative embodiment, a capacitor includes a high-k metal gate over a semiconductor substrate and a polysilicon gate formed next to the high-k metal gate. In still another embodiment, the capacitor further includes a gate dielectric formed over the semiconductor substrate, forming a capacitor dielectric beneath the polysilicon gate. In a further embodiment the gate dielectric includes silicon oxynitride. In yet another embodiment, the capacitor further includes a polysilicon gate doped to form a polysilicon resistor. In an alternative embodiment, the capacitor includes a high-k gate dielectric disposed over the substrate beneath the high-k metal gate. In a further embodiment, the capacitor includes a high-k gate dielectric of hafnium. In another alternative, the capacitor embodiment includes the high-k metal gate of titanium.

In still further embodiments of the capacitor described above, the capacitor further comprises a conductor coupling the high-k metal gate and the polysilicon gate together to form an upper plate conductor for the capacitor. In yet further embodiments, the capacitor of further comprises a conductive region in the semiconductor substrate beneath the high-k metal gate and the polysilicon gate forming a bottom plate for the capacitor.

In yet another embodiment, a semiconductor device includes a capacitor region over a semiconductor substrate, the capacitor region including a first high-k metal gate over the semiconductor substrate; a polysilicon gate over the semiconductor substrate next to the first high-k metal gate; and a logic region comprising a second high-k metal gate over the semiconductor substrate. In a further alternative embodiment, the semiconductor device includes a gate dielectric material underlying the polysilicon gate. In yet another embodiment, the semiconductor device is provided wherein the gate dielectric includes silicon oxynitride. In another embodiment, the semiconductor device further includes a high-k gate dielectric underlying the first high-k metal gate. In still another embodiment, the semiconductor device includes high-k gate dielectric material of hafnium.

In another alternative embodiment, an apparatus includes a capacitor region over a semiconductor substrate, including a plurality of high-k metal gate MOS capacitor devices formed in the capacitor region; and a plurality of polysilicon gate MOS capacitors formed in the capacitor region between the plurality of high-k metal gate MOS capacitor devices, and spacing the high-k metal gate MOS capacitor devices from one another; wherein the surface area of the polysilicon gate MOS capacitors comprises at least 25% of the surface area of the capacitor region.

In additional embodiments, the polysilicon gate MOS capacitors each further include a gate dielectric formed over the substrate and forming a capacitor dielectric; and a polysilicon gate formed over the gate dielectric and forming a top plate of the MOS capacitor. In still further embodiments, gate dielectric includes silicon oxynitride. In yet further embodiments the polysilicon gate is doped to form a polysilicon resistor. In still further embodiments each of the high-k metal gate MOS capacitor devices further includes a high-k gate dielectric disposed over the substrate; and a metal containing gate disposed over the high-k gate dielectric.

In yet a further embodiment, the high-k gate dielectric includes hafnium. In another alternative embodiment the metal containing gate includes titanium.

In another alternative embodiment an apparatus includes a plurality of polysilicon gate strips disposed over a semiconductor substrate forming top plates of MOS capacitors, in parallel and spaced apart; gate dielectric material disposed under each of the polysilicon gate strips forming capacitor dielectric for the MOS capacitors; a plurality of metal gate strips disposed over the semiconductor substrate forming top plates of high-k metal gate device MOS capacitors and adjacent to and alternating with the plurality of polysilicon gate strips; high-k gate dielectric material underlying each of the metal gate strips, forming capacitor dielectric for the high-k metal gate device MOS capacitors; and a portion of the semiconductor substrate underlying the polysilicon gate strips and the high-k metal gate strips doped to form a bottom plate for each of the MOS capacitors. In a further embodiment, the above apparatus includes the gate dielectric material of silicon oxynitride. In yet another embodiment, the above apparatus includes the high-k gate dielectric material of hafnium. In still another embodiment the top plates of the polysilicon MOS capacitors and the metal gate MOS capacitors are coupled together to form a parallel capacitor.

The scope of the present application is not intended to be limited to the particular illustrative embodiments of the structures, methods and steps described in the specification. As one of ordinary skill in the art will readily appreciate from the disclosure above, processes, or steps, presently existing or later to be developed, that perform substantially the same function or achieve substantially the same result as the corresponding embodiments described herein may be utilized according to the present disclosure. Accordingly, the appended claims are intended to include within their scope such processes or steps.

What is claimed is:

1. A capacitor comprising:
    a metal gate over a semiconductor substrate, the high-k metal gate comprising a first top surface distal the semiconductor substrate and a first bottom surface proximate the semiconductor substrate;
    a polysilicon gate laterally adjoining the metal gate, the polysilicon gate comprising a second top surface distal the semiconductor substrate and a second bottom surface proximal the semiconductor substrate, the first top surface and the second top surface being substantially coplanar, and the first bottom surface and the second bottom surface being substantially coplanar; an overlying conductor coupling the metal gate and the polysilicon gate together to form an upper plate conductor for the capacitor; and a plurality of vias coupling the overlying conductor and the polysilicon gate.

2. The capacitor of claim 1, wherein the polysilicon gate further comprises a gate dielectric over the semiconductor substrate, the gate dielectric being a portion of a capacitor dielectric beneath the polysilicon gate.

3. The capacitor of claim 2, wherein the gate dielectric comprises silicon oxynitride.

4. The capacitor of claim 2, wherein the polysilicon gate is doped to form a polysilicon resistor.

5. The capacitor of claim 1, wherein the metal gate further comprises:
    a high-k gate dielectric disposed over the semiconductor substrate; and
    a metal gate on the high-k gate dielectric.

6. The capacitor of claim 5, wherein the high-k gate dielectric comprises hafnium.

7. The capacitor of claim 5, wherein the metal gate comprises titanium.

8. The capacitor of claim 1 further comprising a conductive region in the semiconductor substrate beneath the metal gate and the polysilicon gate forming a bottom plate for the capacitor.

9. A semiconductor device, comprising:
    a capacitor region over a semiconductor substrate, the capacitor region comprising:
        a first metal gate over the semiconductor substrate;
        a high-k gate dielectric material underlying and contacting the first metal gate;
        a polysilicon gate over the semiconductor substrate laterally adjacent and contacting a sidewall of the first metal gate;
        a gate dielectric material underlying and contacting the polysilicon gate; and
        an overlying metal conductor coupling the first metal gate to the polysilicon gate to form an upper plate conductor for a capacitor; and
    a logic region comprising a second metal gate over the semiconductor substrate.

10. The semiconductor device of claim 9, wherein the gate dielectric material comprises silicon oxynitride.

11. The semiconductor device of claim 9, wherein the high-k gate dielectric material comprises hafnium.

12. The semiconductor device of claim 9, wherein the high-k gate dielectric material contacts the semiconductor substrate.

13. The semiconductor device of claim 9, wherein the gate dielectric material contacts the semiconductor substrate.

14. A semiconductor device comprising:
- a semiconductor substrate, a portion of the semiconductor substrate comprising a bottom capacitor plate;
- a high-k dielectric over the portion of the semiconductor substrate;
- a metal gate on the high-k dielectric;
- a gate dielectric over the portion of the semiconductor substrate, the gate dielectric being laterally adjacent the high-k dielectric;
- a polysilicon gate on the gate dielectric, the polysilicon gate being laterally adjacent the metal gate;
- a second polysilicon gate, wherein the metal gate is interjacent the polysilicon gate and the second polysilicon gate in a plane that is substantially parallel to a major surface of the semiconductor substrate; and an overlying metal conductor coupling the metal gate to the polysilicon gate and the second polysilicon gate to form an upper capacitor plate.

15. The semiconductor device of claim 14 further comprising an interlayer dielectric layer adjacent the polysilicon gate.

16. The semiconductor device of claim 14, wherein the bottom capacitor plate is common to the polysilicon gate, the second polysilicon gate, and the metal gate.

17. The semiconductor device of claim 14 further comprising a second metal gate, wherein the second polysilicon gate is interjacent the metal gate and the second metal gate in a plane that is substantially parallel to the major surface of the semiconductor substrate.

18. The semiconductor device of claim 14 wherein the polysilicon gate and the second polysilicon gate are spaced apart by a polysilicon-to-polysilicon minimum distance.

* * * * *

UNITED STATES PATENT AND TRADEMARK OFFICE
CERTIFICATE OF CORRECTION

PATENT NO. : 9,269,833 B2  
APPLICATION NO. : 13/303096  
DATED : February 23, 2016  
INVENTOR(S) : Pai-Chieh Wang Page 1 of 1

It is certified that error appears in the above-identified patent and that said Letters Patent is hereby corrected as shown below:

Claims
In Col. 10, line 12, claim 1, delete "high-k".

Signed and Sealed this
Third Day of May, 2016

Michelle K. Lee
*Director of the United States Patent and Trademark Office*